United States Patent [19]

Angelucci et al.

[11] 4,064,552

[45] Dec. 20, 1977

[54] MULTILAYER FLEXIBLE PRINTED CIRCUIT TAPE

[76] Inventors: Thomas L. Angelucci, 89 Charlan Circle, Cherry Hill, N.J. 08003; Joseph L. Angelucci, 1948 Little Drive, Deptford, N.J. 08096

[21] Appl. No.: 654,749

[22] Filed: Feb. 3, 1976

[51] Int. Cl.² ............................................. H05K 1/04
[52] U.S. Cl. .................................... 361/414; 361/398; 361/401; 29/626
[58] Field of Search ................. 317/101 CP, 101 CM, 317/101 F; 174/52 FP, 52 S, 68.5; 29/626, 624, 625; 339/17 F; 361/401, 398, 414, 400

[56] References Cited

U.S. PATENT DOCUMENTS

| | | | |
|---|---|---|---|
| 3,390,308 | 6/1968 | Marley | 174/52 FP |
| 3,544,857 | 12/1970 | Byrne et al. | 174/52 FP |
| 3,681,664 | 8/1972 | Metzger | 317/101 CC |
| 3,739,232 | 6/1973 | Grossman et al. | 317/101 CP |
| 3,795,043 | 3/1974 | Forlani | 174/52 FP |
| 3,832,769 | 9/1974 | Olyphant, Jr. et al. | 174/68.5 |
| 3,859,723 | 1/1976 | Hamer et al. | 29/626 |

*Primary Examiner*—David Smith, Jr.

[57] ABSTRACT

A multilayer flexible printed circuit tape that functions as a flexible printed circuit carrier for receiving one or more active circuit components and/or other inactive components to provide an electronic module. The multilayer flexible printed circuit tape comprises a plurality of etched foil patterns on dielectric carriers arranged in a plurality of planes or layers. Each foil pattern is connected to individual electrical terminals of said components and is further provided with inter-layer connection means, which are connected through apertures in the multilayer dielectric carrier. The lead-out electrical terminals from the module are provided in a mutual plane to permit ease in making connections of the electrical current terminals to a common plane of a circuit system.

12 Claims, 13 Drawing Figures

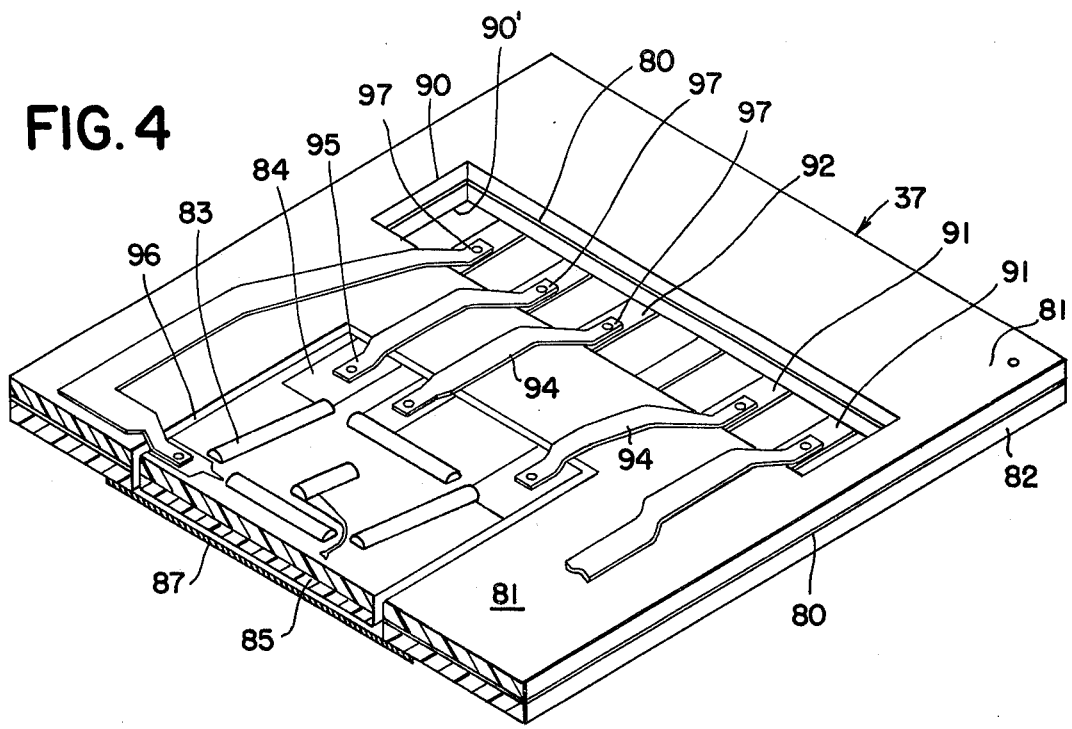
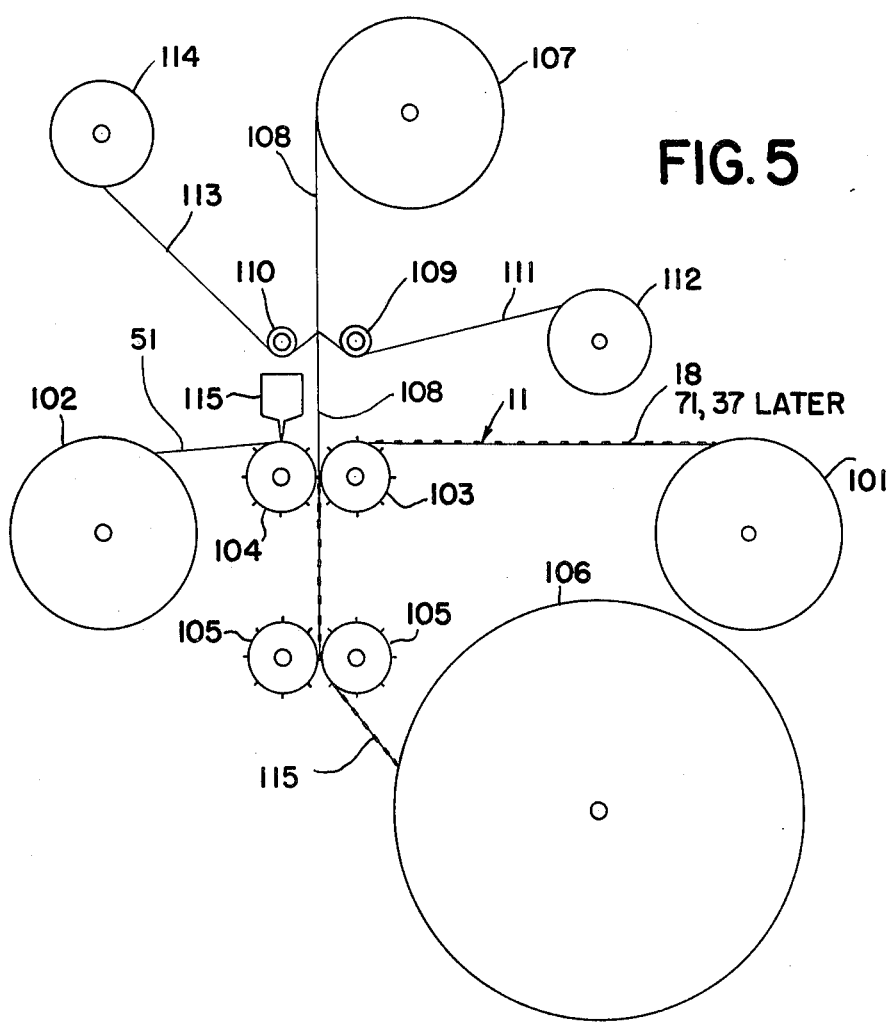

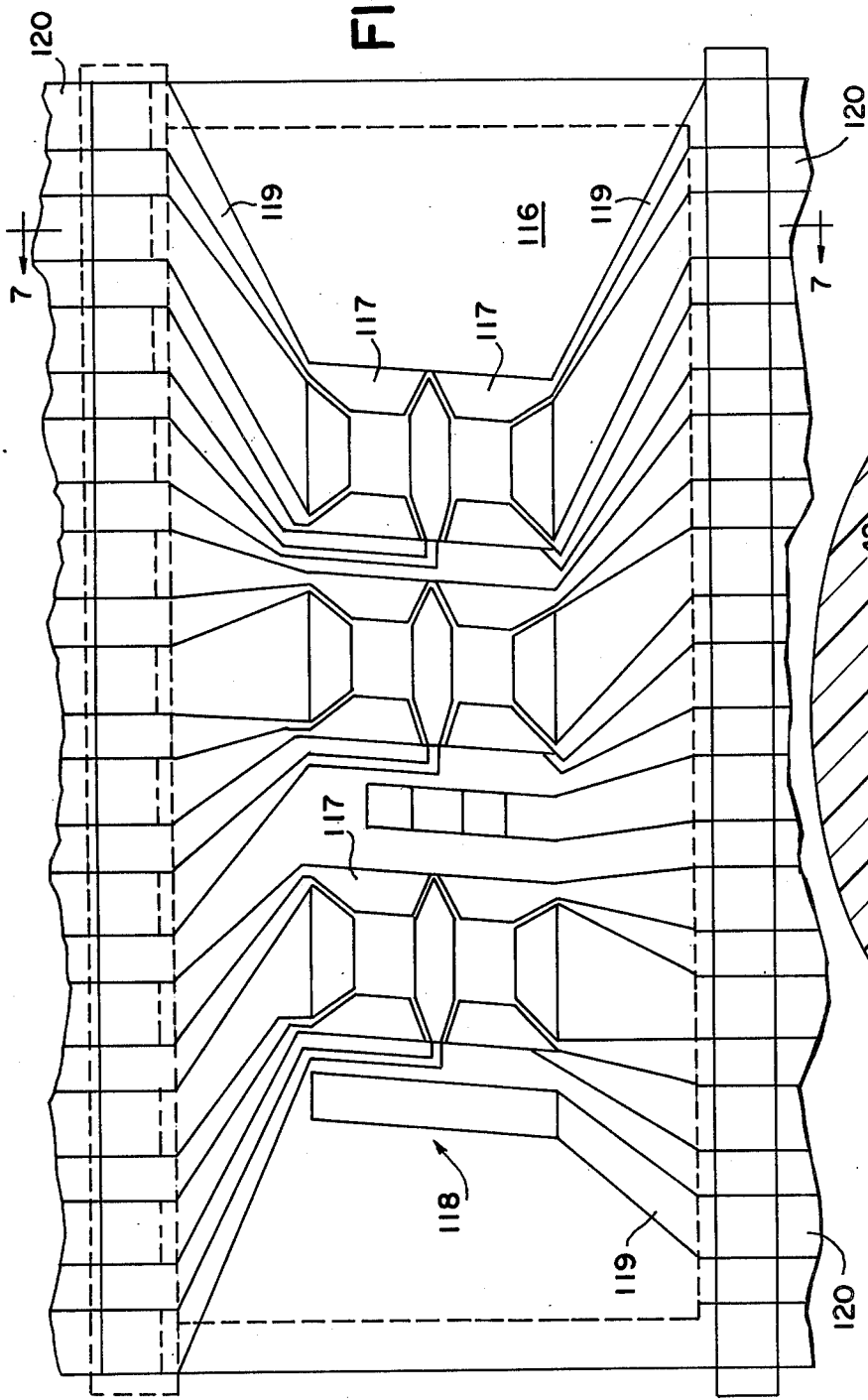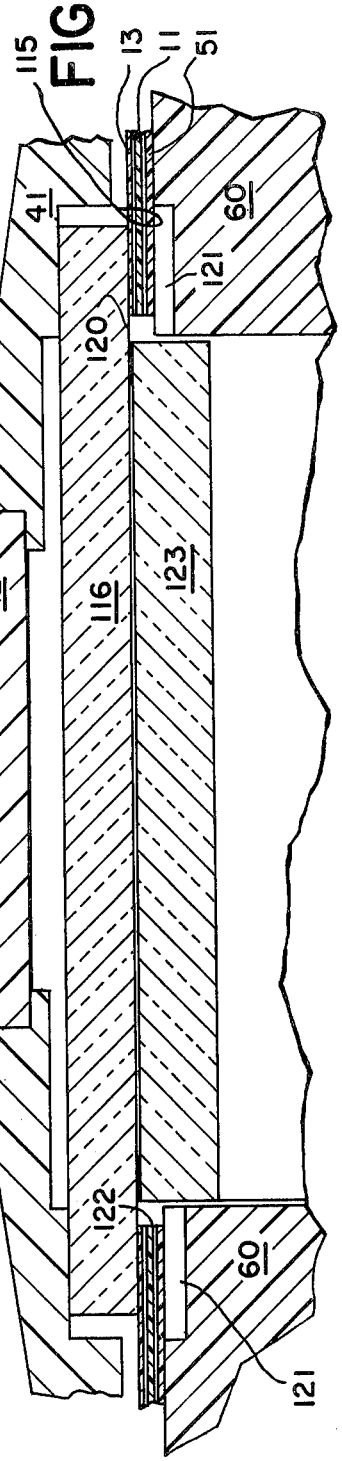

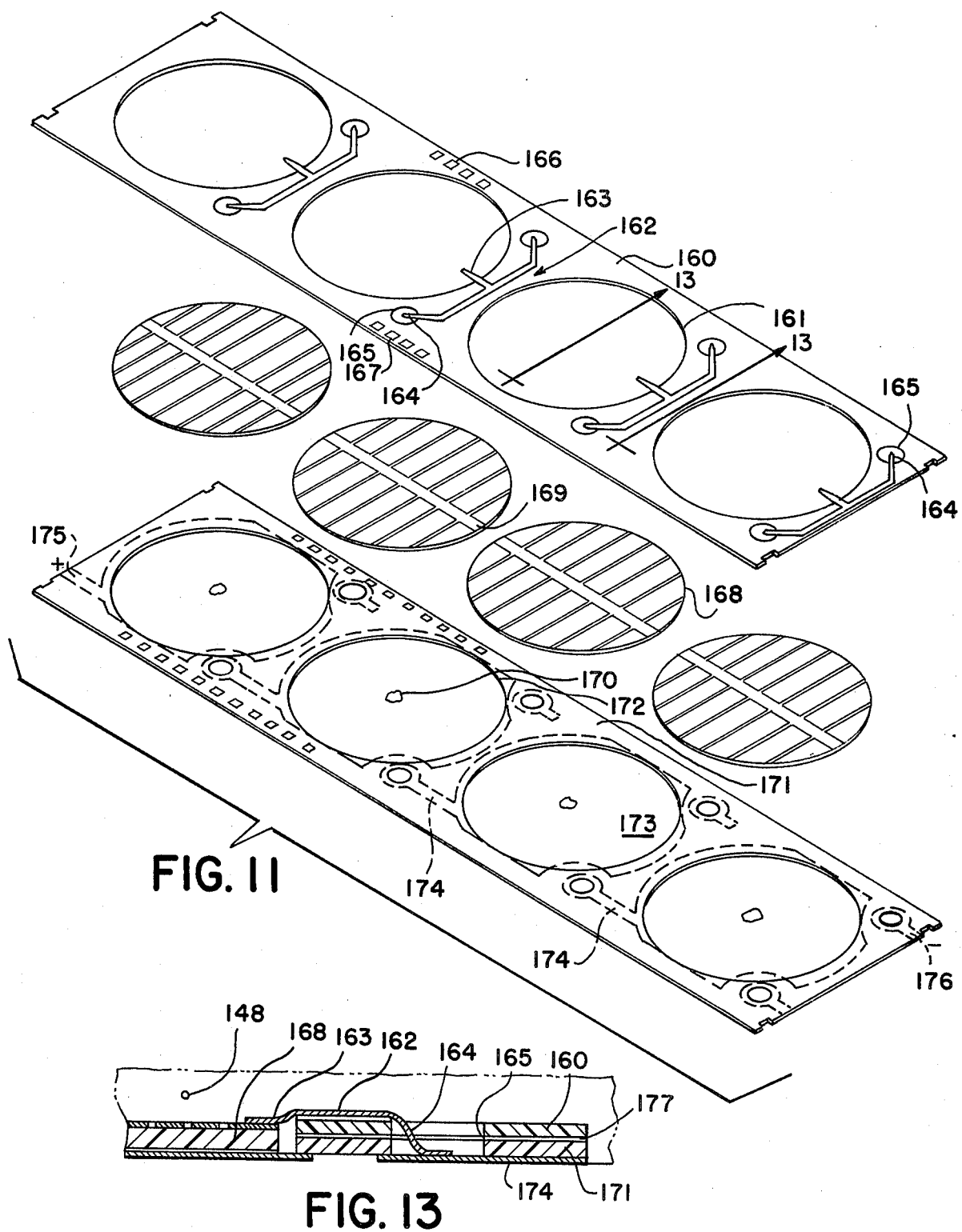

MULTILAYER FLEXIBLE PRINTED CIRCUIT TAPE

BACKGROUND OF THE INVENTION

1. Field of the Invention

This invention relates to conductive foil printed circuit patterns which are laminated to flexible dielectric strip carriers. More particularly, this invention is concerned with flexible sprocketed lead frame tape having a plurality of printed circuit patterns arranged in a plurality of planes and interconnected to components to provide active electronic modules.

The novel printed circuit tape of the present invention is adapted to be supplied in reel form to be used on bonding machines and assembly machines for automatic and semiautomatic production of electronic modules.

2. Description of the Prior Art

In U.S. Pat. No. 3,696,229 there is provided a lead frame carrier having a printed circuit lead frame thereon, which is bonded to raised conductive bumps on an active component. The disclosed method involves aligning electrical leads on the carrier with corresponding contacts and bumps on the active component and then thermocompression bonding the aligned leads to the contacts or bumps. The bonded active component and the pattern having the electrical leads is subsequently separated from the lead frame carrier to provide a beam lead device for assembly on a printed circuit board or substrate. Accordingly, this patent discloses the connection of an active component to a single layer printed circuit carrier or tape.

In U.S. Pat. No. 3,838,984, there is provided a printed circuit lead frame carrier, having electrically conductive gold bumps which extend through via holes in the carrier tape. The gold bumps are connected to the underside of a copper foil lead frame pattern and are extended through the carrier tape and protrude from the opposite side. The gold protrusions or bumps on the flexible tape are adapted to be connected to electrical contacts on an active semiconductor device. The assembly, when stripped or cut from the carrier, provides a beam lead device. In a similar manner, U.S. Pat. No. 3,868,724 teaches an improved technique for plating the gold bumps through via holes to provide an improved beam lead device.

In the electronic data processing field, the main printed circuit boards for receiving both memory and logic printed circuit cards comprise multiple layers of printed circuit patterns. Elaborate and diverse means are employed to connect selective area of one of the conductive printed circuit planes to another printed circuit plane. The most common via connections comprise plated-through holes, pins, rivets and jumper wires. Such multiple layer printed circuit boards are individually assembled, rigid structures. Rigid multilayer printed circuit boards are not provided with flexible leads, however, flexible wires are connected to such rigid printed circuit boards to interconnect components mounted thereon, or to interconnect the printed circuit board into a circuit system.

Printed circuits have been applied to the opposite sides of a single layer rigid board and to a single side of single layer rigid or flexible substrates. The means employed for making interconnections on such boards or substrates have been the same as those employed in making interconnections on the aforementioned rigid multilayer printed circuit boards namely, jumper wires, plated-through holes, rivets and/or pins. Heretofore, such single layer printed circuits have not been adaptable to provide single layer sprocketed flexible tapes, which would permit continuous automatic production.

Heretofore, miniature rigid printed circuit boards and substrates have been employed for the assembly of modules, but have required individual miniature wire bonds to interconnect active compounds and/or connection points.

Heretofore, miniature sprocketed lead frame carrier tapes have been employed for the assembly of discrete components, but have not been employed for the assembly of electronic modules.

Hybrid modules employed in the electronic watch and electronic calculator industry, have heretofore been assembled individually on rigid substrates.

Heretofore, electronic module assemblies were individually assembled in a manner which required a high labor content. Such electronic modules as are assembled for watches, and calculators are known to be extremely fragile when employing ceramic substrates. Individual handling and individually wire bonding of the electronic modules for watches and calculators has produced a high rejection rate. Attempts to produce higher yields have often resulted in passing through inspection marginal or unreliable modules. When electronic modules are assembled individually, there is little or no possibility of incorporating automatic or semiautomatic machines in the production line to increase production. Electronic modules, which are assembled on rigid circuit boards usually require more wire bonds and interconnection wires than are actually necessary.

SUMMARY OF THE INVENTION

The present invention provides a novel multilayer flexible printed circuit tape and a method of assembling the tape to provide a plurality of components thereon.

It is an object of the present invention to provide a novel multilayer sprocketed printed circuit carrier tape for use in the automatic or semiautomatic assembly of electronic modules.

It is another object of the present invention to provide a novel multilayer printed circuit carrier tape which eliminates the need for making miniature wire bonds and conventional electrical wire interconnections.

It is another object of the present invention to provide a novel multilayer sprocketed printed circuit carrier tape which comprises a plurality of novel interconnection leads.

It is a primary object of the present invention to provide a novel multilayer sprocketed printed circuit tape which permits continuous automatic assembly of components thereon so as to substantially reduce assembly time and the cost of the components mounted thereon.

It is yet another object of the present invention to provide a novel multilayer printed circuit carrier tape which increases the yield of assembled electronic modules and increases the strength and reliability of the electrical connections and increases the shock resistance of the module.

In accordance with these and other objects of the present invention there is provided a plurality of dielectric carrier tapes, each of the tapes having a foil pattern thereon which is provided with individual electrical terminals to receive components therein. The foil patterns on the dielectric carriers are further provided with interlayer connection means which are connected through apertures in the multilayer dielectric carriers. Lead-out electrical terminals are provided at the outer extremities of the module in a manner which permits them to be simultaneously connected or automatically connected to the electrical terminals of a common plane of a circuit system.

BRIEF DESCRIPTION OF THE DRAWINGS

FIG. 4 is an isometric view shown in half section of the assembly of the monolithic light emitting diode assembly shown in FIG. 3.

FIG. 5 is a schematic drawing showing a method of joining a top tape to a bottom tape.

FIG. 6 is a plan view of a liquid crystal display assembly comprising conductive lead patterns on a rigid glass plate.

FIG. 7 is a section in elevation showing the assembly of the rigid liquid crystal display of FIG. 6 assembled into a watch case employing a sprocketed multilayer flexible carrier tape.

FIGS. 10 and 11 are exploded isometric views showing sprocketed multilayer flexible carrier tapes for the assembly of solar cells.

FIG. 13 is a section in elevation of the assembled multilayer tape fo FIG. 11 taken at lines 13—13.

DESCRIPTION OF THE PREFERRED EMBODIMENT

Figure 1:
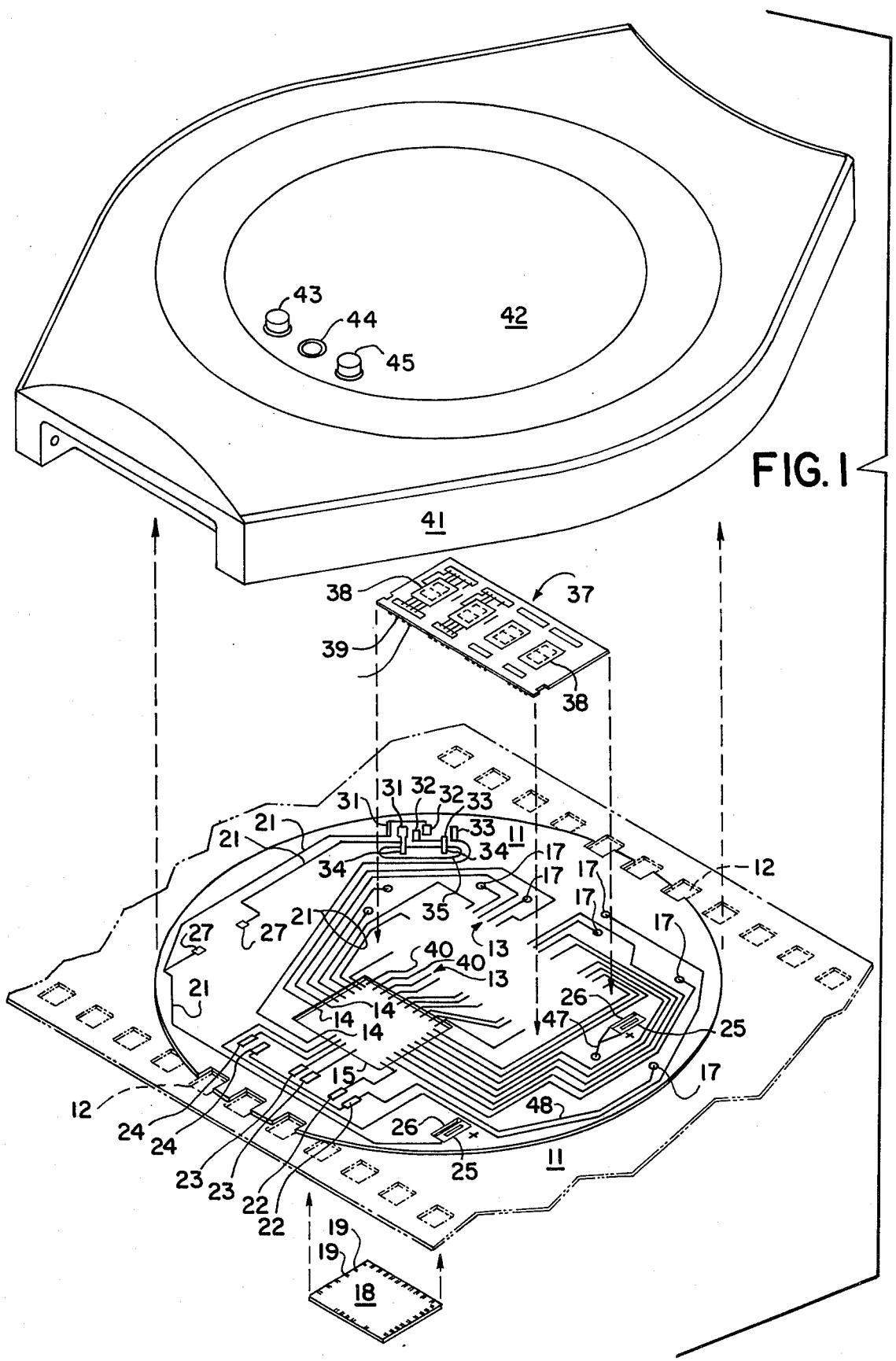
FIG. 1 is an exploded isometric view showing a printed circuit pattern on a top tape of a sprocketed multilayer flexible carrier tape and further showing a logic chip, a watch case, a light emitting diode assembly positioned relative to the carrier tape.

Sprocketed flexible carrier tape 11, shown in FIG. 1, is provided with precision punched index sprocket apertures 12, which are employed for the precision advancing of the carrier tape and the alignment of the tape for automatic processing and for automatic assembly of components to make the module. Tape 11 is preferably made from polyimide or polyester dielectric films in thickness from one to five mils. The shape of the tape is preferably in standard cine format such as 70mm, 35mm, 16mm, super 8mm or 8mm, however, special formats can be employed if economically justifiable.

At first flexible conductive foil pattern 13 is bonded to the top of top tape 11 and comprises a plurality of inner flexible conductive fingers 14 which extend over device aperture 15 and further include a plurality of outerflexible conductive leads 16 which extend over connection apertures 17. A large scale integrated circuit semiconductor device 18 is shown positioned opposite the device aperture 15 and is provided with a plurality of conductive lead-out pads 19 thereon, which are adapted to be connected to the inner flexible conductive fingers 14 of the conductive foil pattern 13. Conductive fingers 14 are located in precise alignment with lead-out pads 19 to enable the conductive fingers to be connected to the lead out pads by gang lead bonding methods, such as soldering or thermocompression bonding. It will be understood that the cantilevered extended fingers 14 can be individually connected to the pads 19. The conductive fingers 14 which are connected to the semiconductor device 18 are connected to flexible conductive leads 21 which eminate from the semiconductor device and are adapted to be connected to other components in the circuit system as will be explained. Other conductive fingers 14 leading from the semiconductor device 18 are connected to control switch contacts 22, 23 and 24 as will be explained in greater detail hereinafter. Other conductive leads 21 are shown connected to battery terminal contacts 25 which are terminated or positioned opposite battery terminal apertures 26 which are adapted to receive conductive battery terminals as will be explained hereinafter. Two flexible conductive leads or paths 21 terminate in pads 27, which are provided for making interconnection with trimmer capacitor 29, having terminals 28 thereon. The pads 27 and terminals 28 can be connected by conventional methods such as soldering or with conductive epoxy. Trimmer capacitor 29 is a standard component which maybe purchased in miniature form for electronic modules such as those employed in timers and watch modules. Battery terminal 25 is shown to have a positive polarity and, when connected via flexible conductive lead or path 21 through capacitor 29 and extended further through flexible conductive leads 21, terminate at pads 31. Pads 31 are adaptive to receive a discrete passive component such as a capacitor which is too large to be made as part of the printed circuit. Similarly, pads 32 and pads 33 are adapted to receive discrete passive components such as another resistor and capacitor which are too large to be deposited as part of the printed circuit. Flexible conductive fingers 34 extend over quartz crystal aperture 35 and are adapted to be connected to a precision quartz crystal device which will be explained in greater detail with regard to FIG. 2.

Multidigit display 37 is provided with a plurality of individual, light emitting diode chips 38, having conductive leads 39 eminating therefrom. The pattern of conductive leads 39 are precisely positioned to align with conductive leads 40 comprising a part of printed circuit pattern 13. Multidigit display 37 may be connected to the printed circuit 13 by conventional solder reflow techniques or with conductive epoxies. Because of the precise registration and the compliant nature of the leads 39 and 40, the multidigit display may be pressed into contact with the conductive leads 40 so as to form a pressure compliant electrical contact connection therewith.

Shown in axial alignment above the printed circuit 13 and multidigit display 37 is a case 41 for enclosing the module. Cases such as the case shown may be forged from metal and machined or injection molded from plastics. Case 41 is provided with a display window 42 which permits the light emitting diode display 37 to be viewed when activated or energized. The usual means for energizing light emitting diodes and to conserve the energy of the batteries, is shown to be control buttons 43, 44 and 45. It will be understood that watch modules of the type described herein may have numerous functions such as hours, minutes and seconds. Additional functions, such as year, month and day are provided on more expensive modules. In the preferred embodiment shown, control button 43 is shown in alignment with control switch contacts 24, control button 44 is shown in alignment with control switch contacts 23 and control button 45 is shown in alignment with control switch contacts 22. The control buttons are spring biased away from the control switch contacts and extend through apertures 46 having seals and bias means therein not shown.

Figure 2:
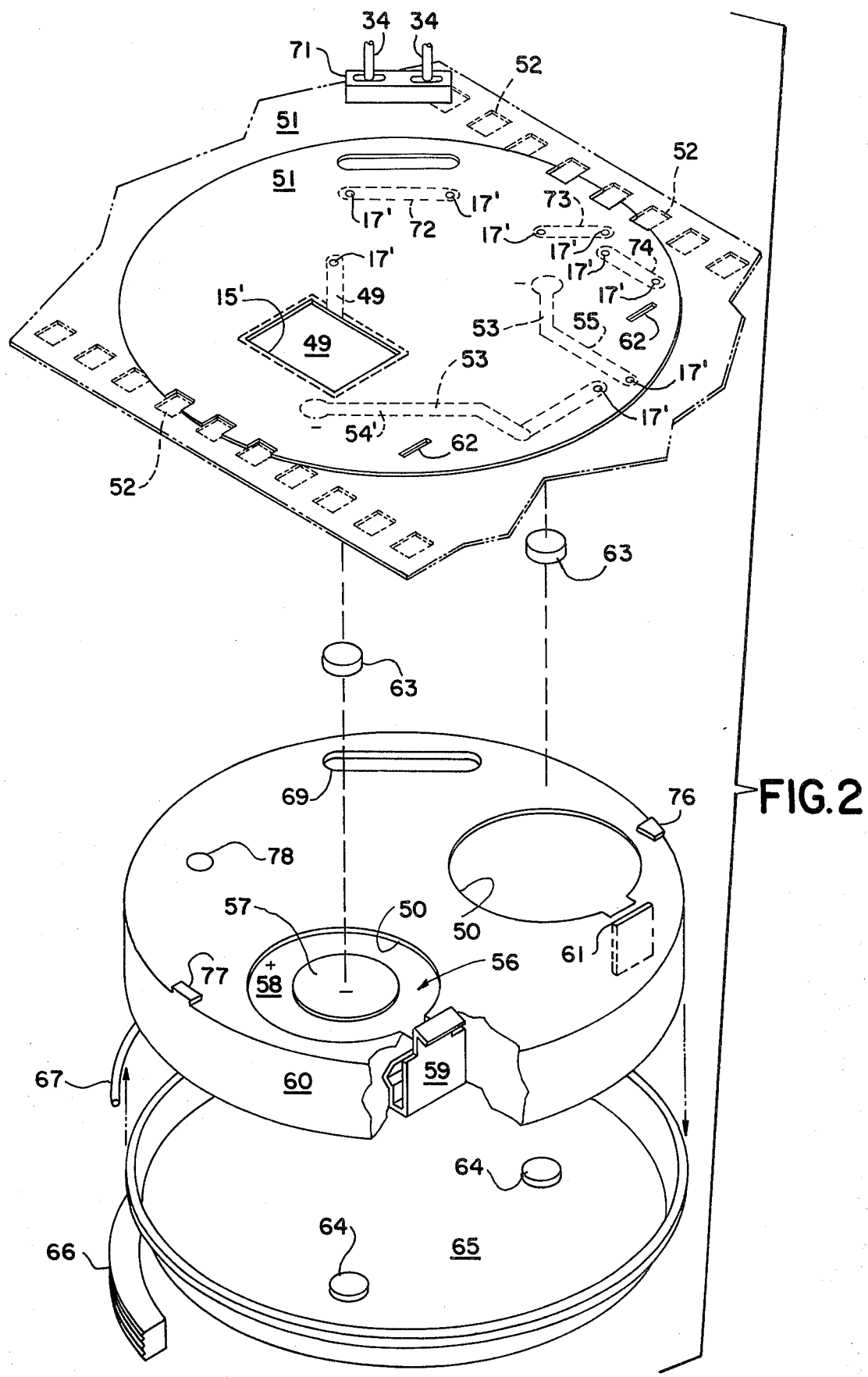
FIG. 2 is an exploded isometric view showing a printed circuit pattern on a bottom tape of a sprocketed multilayer flexible carrier tape and showing a quartz crystal, a plastic frame and a back cover of a watch case.

Bottom tape 51 is shown in FIG. 2 having indexing apertures 52 and connection apertures 17'. The dielectric carrier bottom tape 51 also may be provided with a device aperture 15' for receiving a large scale integrated circuit 18 therein. When the ground plane is on the reverse side of the large scale integrated circuit, it is preferred that a conductive pattern 49 cover the bottom of the aperture 15' to provide encapsulating support and electrically conductive contact. When the ground connection is on the top of logic chip 18, the circuit pattern 13 on the top of top tape 11 may be connected thereto. It will be understood, that when the ground plane connection is on the top of chip 18, that aperture 15' may be dispensed with when the thickness of the chip 18 and the flexibility of leads 14 permit.

Bottom dielectric carrier tape 51 is further provided with a second flexible conductive foil pattern 53, bonded to the bottom of said bottom tape 51 and have a plurality of intermediate flexible conductive paths 54 and 55. The minus terminal of conductive path 54 is adapted to connect to a minus terminal 57 of a battery 56. The opposite end of path 54 is connected to conductive path 47 on tape 11 which terminates at positive battery terminal contact 26 via apertures 17 and 17' in top tape 11 and bottom tape 51, respectively. The negative terminal of conductive path 55 is adapted to be connected to another battery 56 (not shown) at the negative terminal thereof, via a conductive resilient contact 63. The other end of conductive path 55 is adapted to be connected to conductive path 48, shown in FIG. 1 through apertures 17 and 17' of top tape 11 and bottom tape 51 respectively. The other end of conductive path 48 on top tape 11 is shown terminating at one of the control switch contacts 22. A typical battery 56 is shown mounted in one of the battery apertures 50 of cage 60 and having a negative terminal 57 and a positive terminal 58 which comprises the side of the battery case. The positive side of the battery in the preferred embodiment is in contact with a battery clip 59 which touches the side of the battery 56 at positive terminal 58. The vertical side of the battery clip 59 is inserted in at aperture 61 of frame or cage 60 and extends through apertures 62 in bottom tape 51 and further extends through apertures 26 in top tape 11 and makes appropriate connection with the battery terminals contacts 25 by being bent over or making appropriate connections therewith.

In the preferred embodiment shown, two batteries 56 are mounted in the apertures 50, which have shoulders (not shown) at the top to prevent the batteries from being placed in the apertures in the wrong polarity. Batteries 56 are held in place by non-conductive spring elastic buttons 64 cemented to the bottom of case 65 and urge the batteries into the apertures and against the spring or elastomer conductive contact 63 which are bonded to the negative polarity terminals of conductive paths 54 and 55 respectively. It will be understood that watch modules for liquid displays may only require a single battery and the cage or frame 60 and circuitry 53 explained herein can be adapted to a single battery with minor modifications. It will be understood further that the positive battery contact shown in this preferred embodiment does not make contact with the back of the case 65, as can occur in watch cases which are made of conductive metal. Since this embodiment is designed to be universally adapted to both metal and plastic watch cases, all of the circuitry is provided within the module itself and does not require a conductive path through the case. The back 65 is adapted to be held to the front case 41 by case clamp nut ring 66 and is sealed in the case by an O ring gasket 67 to make the composite case watertight.

Bottom tape 51 is further provided with aperture 68' which is aligned with larger and deeper clearance recess 69 in frame 60. Recess 69 and apertures 68 and 68' are adapted to receive a quartz crystal 71 therein. Quartz crystal 71 is connected to the circuit pattern 13 by flexible conductive fingers 34. After the top tape 11 is assembled to the bottom tape 51, the quartz crystal 71 can be connected to its conductive fingers 34 and encapsulated in the module by a resilient polymer to permit the complete module to be tested externally from the frame or cage 60 and the watch itself. The conductive pattern 53 on bottom tape 51 further comprises conductive foil paths 72, 73 and 74 bonded to the bottom of bottom tape 51 and providing cross-over paths which have connections to conductive fingers which connect through the connection apertures 17 and 17' provided on top tape 11 and bottom tape 51.

It will be understood and explained in detail hereinafter that top tape 11 and bottom tape 51 are connected in exact registration by alignment of the indexing apertures 12 and 52 respectively. Once the indexing apertures 12 and 52 are aligned and the watch module is being assembled, there is provided on frame or cage 60, film locating lugs 76 and 77 which fit into the indexing apertures 12 and 52 respectively. Cage 60 is shown to have a flat top surface. However, cage 60 may be provided with clearance recesses or apertures, such as aperture 78 provided for clearance of the trimmer capacitor. Any other components which require replacement on the bottom tape may have clearance recesses or apertures molded into the frame or cage 60.

Figure 3:
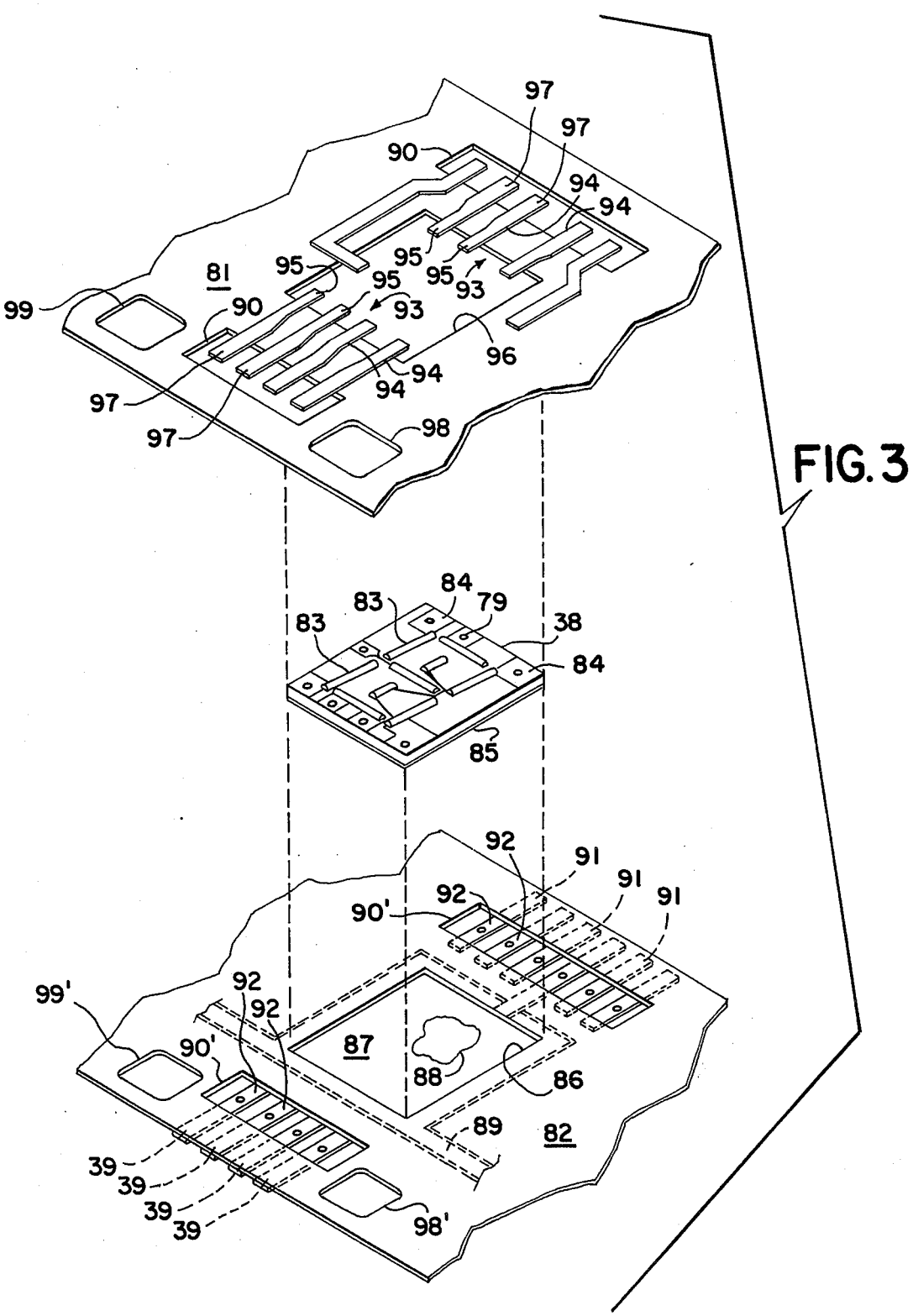
FIG. 3 is an exploded isometric view showing a top tape and a bottom tape for mounting a monolithic light emitting diode chip of the type shown in FIG. 1.

FIG. 3 shows a top tape 81 and a bottom tape 82 of the type described herein before with regards to FIGS. 1 and 2. Dielectric tapes 81 and 82 show a single frame of a continuous dielectric tape of the type adapted to make multidigit displays 37. A single digit display 38 of the light emitting diode type, is shown in alignment with the mounting apertures in tapes 81 and 82 as will be explained. Individual segments 83 on display 38 are made in a deposition or diffusion process and are provided with anode terminal pads 84 which connect to individual segments 83. The anode terminal pads 84 have a central portion indentified as point 79 which are the bonding targets or bonding points. The bottom of single digit display 38 is a common cathode ground plane 85 which is always-on for display of any one or more of the segments 83 of digit display 38.

In the final assembly of tape 81 to tape 82, the single digit display 38 will be connected to conductive foil pattern 87 which is exposed through aperture 86 provided with the conductive epoxy glob 88 to make electrical connection with the common cathode 85 on the back of single digit display 38. The conductive pattern on the back of tape 82 comprises lead-outs 39, which are the same lead-outs as shown in FIG. 1, and lead-outs 91 which are adapted to be connected to the conductive foil circuit pattern 13 on FIG. 1. Common cathode bus 89, which is connected to the conductive pattern or plane 87 is also adapted to connect to one of conductive paths 21 on FIG. 1. Top dielectric tape 81 is provided with connection apertures 90 which are in the same position as the connection apertures 90' on bottom dielectric tape 82. The conductive foil pattern 93, bonded to the top of top tape 81 comprises a plurality of intermediate conductive paths 94 having inner fingers 95 which extend over aperture 96 and a plurality of outer fingers 97 which extend over apertures 90. The fingers 95 are gang bonded by, or individual bonded by soldering thermocompression bonding or ultrasonic bonding to the bonding points 79 of pads 84 on digit display 38. It will be understood that once the digit display is bonded to the inner fingers 95, tape 81 maybe assembled to tape 82 and the outer fingers 97 on tape 81 may then be bonded to the bonding pads 92 on bottom tape 82 to provide continuous connection to the lead-out terminals 91 on bottom tape 82 and to provide continuous connections to lead-out terminals 39 which are connected to the circuit pattern 13 shown in FIG. 1.

In the preferred embodiment illustrated, the bottom tape 82 and the top tape 81 encapsulate and offer protection to the multidigit 37. It will be understood that once the single digit or multidigit displays are connected to a tape 81, it is entirely possible that the bottom tape and its connections may be dispensed with by a minor modification of bringing out the common cathode connections. The conductive circuit pattern shown on bottom tape 82 may be exactly duplicated and presented as part of circuit pattern 13 so that the top tape 81 holding the multidigit display chips onto the top tape 81 may be bonded thereto. In the preferred embodiment the reason for encapsulating the digit display between two tapes is to provide a replaceable module which may be connected to or disconnected from the tape assembly shown in FIGS. 1 and 2. Sprocket or indexing apertures 98 and 99 provided on top tape 81 are in registration with sprocket or indexing apertures 98' and 99' on bottom tape 82. It will be understood that these indexing apertures are employed to provide the proper registration for assembling the tapes.

Refer now to FIG. 4 which shows a single light emitting diode digit display assembled between a top tape 81 and a bottom tape 82. After the fingers 95 are connected to the anode bonding terminals, 84, the display digit 38 is carried by top tape 81. Bottom tape 82 is assembled to top tape 81 carrying the digit display 38 by an adhesive layer 80. The connection of the common cathode 85 is made to the bottom conductive pattern 87 by mashing or urging the digit display 38 into engagement with the conductive epoxy blob 88 provided on the conductive pattern 87. FIG. 4 also illustrates the manner in which intermediate conductive paths 94 are connected through connection apertures 90 and 90' to the bonding pads 92 of the lead out terminals 39 and 91.

FIG. 5 is a schematic drawing showing a method of assembling a top tape 11 to a bottom tape 51. It will be understood that the same method may be used to assemble top tape 81 to bottom tape 82. The bottom tapes and top tapes may be individually prepared and placed on reels 101 and 102 prior to the time they are to be used. A preferred method of preparing such tapes is to start with wide sheet material such as polyimide or polyester sheets. A coating of adhesive is applied to one of the surfaces and cured in an oven to the point where it is no longer sticky at normal temperatures. The adhesive sheet may be slit to provide reels of film material in preferred cine widths. The adhesive coated film material is then perforated to provide the indexing apertures and any other desired apertures. The sprocketed adhesive coated film is then run through a laminator to bond a continuous foil strip to the adhesive on the film. The pattern on the foil strip on the film is then made by applying a photo resist. A pattern is exposed developed and etched leaving a desired foil pattern on the film. The film is wash, dried and stored on reels with separation sheets. A reel 101 of top tape 11 is provided on a rotatable mount, not shown, and opposite thereto is provided a reel 102 of bottom tape 51 on a rotatable mount, not shown, Tape 11, having a semiconductor device 18 bonded therein, is fed over sprocket roll 103, having index teeth thereon. Bottom tape 51 is fed over sprocket roll 104, having sprocket teeth thereon. The two tapes are pressed together between the sprocket rolls and fed to a pair of pressure rolls 105, which complete the surface to surface connection of the adhesive before the combined tapes 11 and 51 are reeled onto takeup reel 106. Supply reel 107 is provided with a supply of double surface pressure sensitive tape 108. It will be understood that the double sensitive surfaces are provided on a stable film, having apertures therein, which coincide with the apertures on top tape 11 and bottom tape 51. The protective liners 111 and 113 on the top and bottom of tape 108 are stripped over strip rolls 109 and 110 so that the liners 111 and 113 are reeled up on take-up rolls 112 and 114. The strip of double sensitive tape 108 is indexed through index rolls 103 and 104 so that the initial contact is made in exact registration and proceeds to pressure tolls 105 which complete the adhesive bonding step. It will be understood that all of the apertures on the three different tapes are in exact alignment with each other when they meet in the indexing station comprising sprocket rolls 103 and 104. As bottom tape 51 passes over the top of sprocket roll 104 an conductive epoxy dispensing station 115 dispenses globs of conductive epoxy material, which is deposited on the center of the conductive pattern 49, which is provided to receive the semiconductor device 18. The manner in which the glob is synchronized so as to deposit the conductive adhesive on the conductive pattern in the center thereof is not a part of this invention, and is not explained in detail, however, the movement of index rolls 103 or 104 may be used to synchronize the deposition of this epoxy glob.

In the preferred embodiment explained herein before, the multilayer flexible film printed circuit tape 115 that is reeled onto take-up reel 106 has not yet had applied thereto all of the active and passive components to complete the module. The reel of multilayer flexible film printed circuit tape 115 may be fed through an assembly station, in which the multidigit display 37 is connected to the printed circuit pattern 13 on the top of the top tape. The tape 115 may be fed through another assembly station in which the quartz crystal 71 is inserted through the bottom of the bottom tape 51 (aperture 68'). After being connected to flexible conductive fingers 34, the quartz crystal 51 may be encapsulated with a resilient polymer. In similar manner, the reel of flexible film printed circuit tape 115 may be fed to other assembly stations for the assembly of the ceramic trimmer capacitor 29 and the passive components, which are connected to the conductive pads 31, 32, and 33, explained hereinbefore. After all of the components are connected to the flexible film printed tape, the tape may be fed through a testing station provided with probe points. Power and test perameters are applied to the probe points to determine if the module is operating properly, before it is placed onto the case before being cut from the continuous tape. FIG. 6 shows a liquid crystal display of the type which may be used with the multilayer flexible film printed circuit 115 described hereinbefore with regards to FIG. 5. FIG. 6 is taken looking through a substantially transparent glass substrate 116, showing individual digit segments 117, deposited on the bottom thereof, to provide a plurality of such segments in a digit display 118 format. The individual digits segments 117 are connected by transparent conductive paths 119 to transparent conductive lead-out pad 120. The manner in which liquid crystal displays are made is not a part of this invention and is not discussed in detail herein.

FIG. 7 is a section and elevation taken at lines 7—7 of FIG. 6 showing the manner in which the liquid crystal display is mounted in the watch case 41 of the type discussed hereinbefore, with regard to FIG. 1. Substrate 116 is shown having a transparent lead-out pad 120, which is in compression contact with the printed circuit pattern 13 of top tape 11. It will be understood that the combined top tape 11 and 51 will require an aperture 122 similar to aperture 15 to receive the lower half of the substrate 123 of the liquid crystal display. A tape 115, having a proper circuit pattern for a liquid crystal display is made in the same manner in which a tape 115, having circuit pattern 13, is made for the light emitting diode. It will be understood that the circuit pattern shown for the liquid crystal display is not a complete pattern and is only illustrative of the invention herein.

The module is assembled into watch case 41 having a window or crystal 42. The liquid crystal display 116, 123 is first placed into the watch case 41 and then the finished multilayer flexible printed circuit 115 is placed thereon. A resilient plastic gasket 121 is placed opposite the plurality of transparent lead-out pads 120, and the frame or cage 60 is forced into contact therewith. When the back of the watch case is connected, the conductive pads 120 are forced into pressure contact with the circuit pattern leads on printed circuit pattern 13 of top tape 11. It will be understood that the individual pads make connection with individual leads of the circuit pattern and provide pressure contact therewith.

Having explained how a liquid crystal display with a rigid substrate 116,123 can be incorporated into the present invention employing a multilayer flexible printed circuit 115 it will now be understood that the multidigit light emitting diode display herein before described with regard to FIGS. 3 and 4 may also be installed in the watch case 41 so as to provide a nonpermanent or removable display module. Further, it will now be understood that the display module, which comprises a top tape 81 connected to a multidigit display 38 can be made without a bottom tape 82, when provided with outer lead-out terminals, such as fingers 97, so that the light emitting diode module can comprise a single top tape and a plurality of individual digit displays. Such modules may be used in the present invention by pressure contact so as to provide a means for quick removal and replacement of a most sensitive element of a watch or calculator module.

Figure 9:
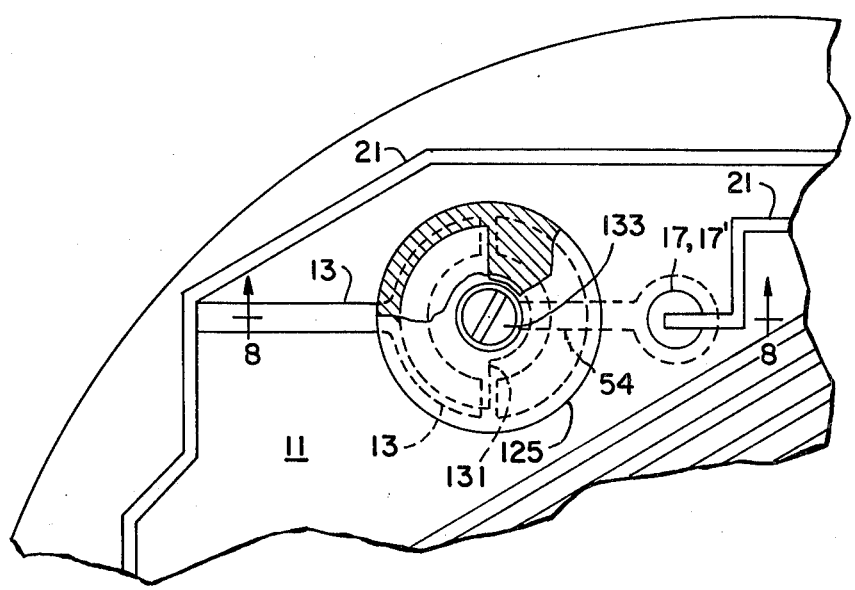
FIG. 9 is a plan view of the trimmer capacitor of FIG. 8.
Figure 8:
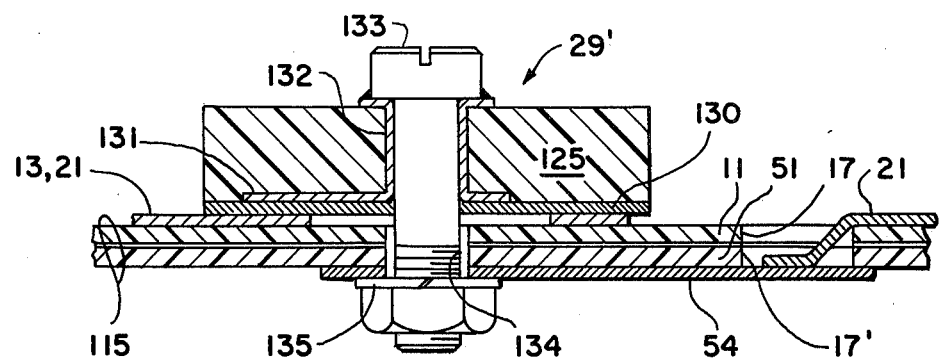
FIG. 8 is a section in elevation of a modified trimmer capacitor which employs part of the carrier tape pattern as an element of the capacitor.

FIGS. 8 and 9 are details of a modified trimmer capacitor which may be made as part of the printed circuit pattern 13 shown in FIG. 1. Modified trimmer capacitor 29' comprises a ceramic annular disc 125 on which is located a conductive segment 131 having a lead-out lead 132 which is fixedly attached to an adjustment screw 133. Dielectric spacer 130 separates segment 131 from conductive pattern 13, 21. It will be understood that when the adjustment screw 133 is turned, the ceramic disc 125 and segment 131 thereon turn with the adjustment screw 133. Conductive adjustment screw 133 is extended through an aperture in 134 in multilayer tape 115. A compression washer or series of conductive washers 135 are connected to conductive attachment adjustment screw 133 and make contact with the circuit pattern 54 on the bottom of bottom tape 51. The bottom tape is connected to the circuit pattern 13 (not shown) through connection apertures 17 and 17' to provide a connection to path 21. The manner in which the wave washer or conductive washer 135 is made to prevent the adjustment screw from moving after being regulated is a matter of engineering choice. In some devices which require high shock resistance, a small point of adhesive may be attached between the ceramic disc 125 and the top of top tape 11, but is not usually required.

Having explained how a multilayer flexible tape 115 can be made and later used for the assembly of components thereon, it will be understood that this invention is not restricted to a light emitting diode, having a single layer tape or a double layer tape. This invention envisions the use of chromeric displays which are presently in the development stage. The present invention eliminates rigid ceramic and phenolic substrates which are common in the watch module and calculator module art. The manner in which the components are assembled on continuous reels of tape also provides a means for precision locating components relative to a printed circuit pattern so as to effectively use automated and semiautomated machine techniques. The multilayer flexible printed circuit tape eliminates the need for fragile bonding wires and connections, such as those made with gold wire as well as the need for individual handling fo substrates. It should be apparent that the multilayer flexible printed circuit tape offers a more shock resistant module than has heretofore been known.

Having explained the preferred embodiment and how minor variations can be made in the preferred multilayer printed circuit tape, it will be understood that a more complex printed circuit may be placed on the bottom tape that has been described herein. The fingers which connect through the connection apertures may be provided on the printed circuit 54 as well as on circuit pattern 13. Outer leads which appear on the top tape and the bottom tape will still form in a mutual plane. Fingers can be placed on the circuit 13 or circuit 54 may be extended over the apertures, 17, 17'. During assembly, conductive epoxy globs may be placed in the aperture 17' of the bottom tape so that during the assembly process, when the tapes are squeezed together, the electrical connection is made between the fingers on the top and bottom conductive paths. The fingers shown in FIGS. 1 to 4 may also be made by spot welding the bottom circuit to the top circuit through the apertures 17, 17'.

Figure 10:
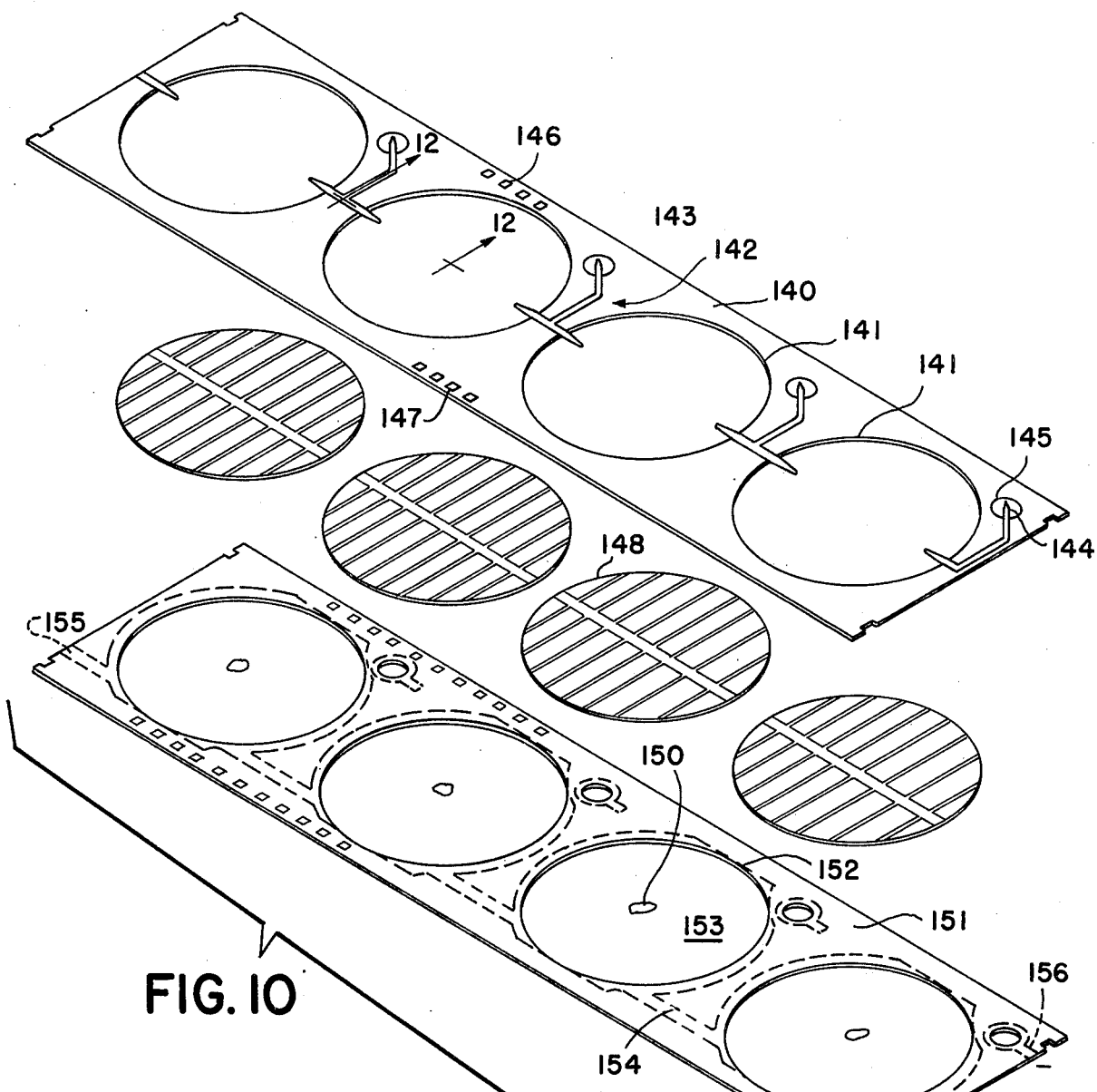

FIG. 10 shows a modification of the preferred embodiments, wherein simple solar cells, having two basic terminals, may be assembled as modules employing a plurality of solar cell devices connected together to form energy panels. The first flexible printed circuit top tape 140 is provided with apertures 141 to receive the solar cell wafers. The first flexible conductive foil pattern, 142, is bonded to the top of the top tape and is provided with inner flexible conductive fingers 143, which extend over said device apertures 141 and is further provided with outer flexible conductive leads 144, which extend over connection apertures 145. The top tape further comprises a plurality of indexing apertures 146 and 147 which are located in registration relative to the apertures 141. Each solar cell wafer, 148, is provided with at least one lead out pad 149, thereon. The solar cells 148, are adapted to be conductively connected to the bottom tape by conductive epoxy, solder of equivalent 150, which make connections to the underside positive leadout pads (not shown). Bottom tape 151 is provided with apertures 152 therein, for receiving solar cells 148. Bonded to the bottom of the bottom tape is a second flexible conductive foil pattern 153, which comprises a plurality of intermediate flexible conductive paths 154 as a part thereof. The intermediate flexible conductive paths on the bottom of the bottom tape further comprise positive and negative lead-out terminals 155 and 156 respectively. The method of assembling the energy panels is similar to the method of assembly described with regards to FIG. 5 hereinbefore. The bottom tape is manufactured and placed on a reel and when it is unreeled, the wafers are placed into the apertures 152 in the bottom tape, in proper alignment and orientation for assembly. The top tape is assembled in registration over the bottom tape carrying the solar cells 148. At another work station, after the two tapes are assembled together, with an adhesive layer not shown, the inner conductive fingers 143 are connected to the terminals 149 of the solar cells 148 and the outer conductive fingers, 144, are connected through apertures 145 to the negative output terminals 156. The method of connecting inner fingers 143 and outer fingers 144 to their respective terminals has been explained herein before, with regards to the preferred embodiment. It will be understood that only one of the outer fingers 144 needs to be connected to a lead-out terminal 156, when the solar cells 148 are connected in parallel as shown in FIG. 10.

Refer now to FIG. 11, showing a series arrangement for connecting solar cells into energy panels. A first flexible printed circuit top tape 160 is provided with device apertures 161 and has bonded thereon a plurality of first flexible conductive foil patterns 162, comprising inner fingers 163 and outer fingers 164 and 164'. Solar cells 168, having lead-out pads 169 are bonded to the bottom tape through means of conductive epoxy 170 or the equivalent thereof. Bottom tape 171, having device apertures 172 therein, is provided with a second flexible printed circuit path 173, comprising intermediate flexible conductive paths 174 and terminal lead-out paths 175 and 176. The solar cells 168 are assembled in the apertures of the bottom tape and the bottom tape is assembled to the top tape by means of an adhesive layer, which is not shown. The continuous conductive path will start at positive terminal 175 and extends through a solar cell and comes out at inner conductive finger 163 and proceeds through the conductive path 162 and down through the outer conductive finger 164, through aperture 165 to the intermediate conductive path 174, and connects to the bottom of the next solar cell to connect the whole energy panel in a series circuit array. It will be understood that the device apertures 161 and 172 are in registration with the indexing apertures 166 and 167 and are precisely located so that the connection apertures 165 are also in axial alignment. In the preferred embodiment of assembling energy cells of the type described with regard to FIGS. 10 and 11, both parallel and series modules or energy panels are employed to obtain proper high voltage and high current.

Figure 12:
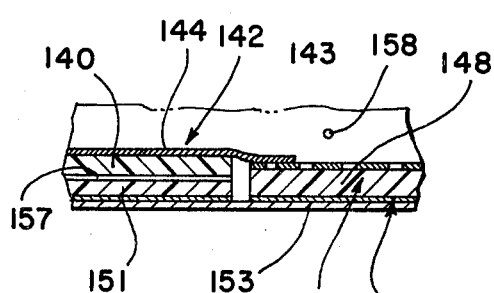
FIG. 12 is a section in elevation of the assembled multilayer tape of FIG. 10 taken at lines 12—12.

FIG. 12 shows the first flexible conductive foil pattern 142, having inner fingers 143 connected to the terminals on solar cell 148. The outer conductive leads 144 for the parallel arrangement may comprise a continuous bus 144, which extends the length of the tape or have a more sophisticated pattern as shown in FIG. 10. The conductive foil pattern 142 is bonded to the top of top tape 140. The bottom tape, 151, having an intermediate conductive path 153 bonded to the bottom thereof, is connected to the top tape by means of an adhesive layer 157. The space or layer shown under solar cell 148 is indicative of a conductive epoxy or solder 150 employed to connect the terminal lead-out pad on the bottom of solar cell 148 to the intermediate conductive pattern 153.

FIG. 13 shows the section through the solar cell of FIG. 11 wherein top tape 160 is connected to bottom tape 171 by means of an adhesive layer 177. The printed circuit pattern 162 comprises inner fingers 163, which are connected to solar cell 168 by conventional bonding means and the outer fingers 164 of the printed circuit pattern 162 are extended downward through the apertures 165 and are connected by conventional bonding means to the intermediate conductive pattern 174 bonded to the bottom of bottom tape 171. A clear liquid or film protective layer 178 may be applied over the energy panels to provide protection to the solar cells. For purposes of this explanation, these solar cells may be made of silicon, gallium aresenide, or other photovoltaic materials. For purposes of simplifing the explanation of this invention, solar cells of the silicon or gallium arsenide type are considered to be wafers of semiconductor material and are semiconductor devices.

We claim:

1. A multilayer flexible printed circuit tape having conductive attachment leads terminating in a mutual plane comprising:

a first flexible printed circuit top tape, said top tape comprising a first dielectric carrier having at least one device aperture for receiving a semiconductor device, a plurality of connection apertures and a plurality of indexing apertures therein, a first flexible conductive foil pattern bonded to the top of said top tape comprising a plurality of inner flexible conductive fingers extending over said device aperture and a plurality of outer flexible conductive leads extending over said connection apertures, a semiconductor device positioned in said device aperture and having a plurality of conductive lead-out pads thereon connected to said inner conductive fingers of said first conductive foil pattern, a second flexible printed circuit bottom tape, said bottom tape comprising a second dielectric carrier comprising a plurality of connection apertures and a plurality of indexing apertures therein, said apertures having the same location pattern as said aperture in said top tape, an adhesive layer bonding the top of said second dielectric carrier to the bottom of said first dielectric carrier to form a laminate therewith, a second flexible conductive foil pattern bonded to the bottom of said bottom tape comprising a plurality of intermediate flexible conductive paths thereon, and a plurality of said outer flexible leads on said top tape extending through said connection apertures of said tapes and being bonded to said individual conductive leads on said bottom tape to provide a multilayer printed circuit tape.

2. A multilayer flexible printed circuit tape as set forth in claim 1 wherein said first flexible conductive foil pattern further includes, a plurality of intermediate flexible conductive paths, and a plurality of discrete components connected to some of said intermediate flexible conductive paths to form an electronic circuit module therewith.

3. A multilayer flexible printed circuit tape as set forth in claim 1 wherein one of said flexible conductive foil patterns further includes, a plurality of intermediate flexible conductive paths, and a plurality of discrete components connected to some of said intermediate flexible conductive paths to form an electronic circuit module therewith.

4. A multilayer flexible printed circuit tape as set forth in claim 3 wherein one of said discrete components comprises a display mounted on a flexible tape which is mounted on said multilayer flexible printed circuit tape.

5. A multilayer flexible printed circuit tape as set forth in claim 3 which further includes a case for holding said module, and a frame for retaining said module in said case, 6. A multilayer flexible printed circuit as set forth in claim 5 which further includes a first polarity battery terminal connection connected to at least one of said plurality of said flexible conductive leads of said bottom tape.

7. A multilayer flexible printed circuit tape as set forth in claim 6 wherein at least one other of said plurality of said intermediate flexible conductive paths comprises a second polarity battery terminal connection.

8. A multilayer flexible printed circuit tape as set forth in claim 3 which further includes a trimmer capacitor comprising one of said conductive foil patterns bonded to one of said dielectric tapes.

9. The method of making multilayer flexible printed circuit tape comprising the steps of:

forming a first and second imperforate flexible dielectric strips of tape, applying an adhesive layer to one side of said first and said second dielectric strips of tape, perforating said dielectric strips of tape with a plurality of indexing apertures, a plurality of connection apertures and at least one device aperture, therein, bonding conductive foil strips to said adhesive layer on said first and said second dielectric strips of tape, forming a conductive pattern in said conductive foil strip on said first dielectric strip of tape to provide a plurality of conductive cantilever leads extending into and over said device aperture and said connection apertures, bonding said conductive cantilever leads at said central aperture to the electrical connection points on a semiconductor device, forming a conductive pattern in said conductive foil strip on said second dielectric strip of tape to provide a plurality of conductive leads having bonding pads in pattern registration with said conductive cantilever leads at said connection apertures, adhesive bonding said first and said second dielectric tapes together at the sides opposite the foil coated sides with said indexing apertures, said connection apertures and said device apertures in pattern registration, and bonding said conductive cantilever at said connection apertures to said conductive leads at said bonding pads at said connection apertures to provide a multilayer flexible printed circuit tape.

10. A multilayer flexible printed circuit tape having conductive attachment leads for interconnecting a plurality of active components comprising:

a first flexible printed circuit top tape, said top tape comprising a first dielectric carrier having a plurality of device apertures therein for receiving active semiconductor devices and a plurality of indexing apertures, a first flexible conductive foil pattern bonded to the top of said top tape comprising a plurality of inner flexible conductive fingers each extending over one of said device apertures and a plurality of outer flexible conductive leads, semiconductor devices positioned in said apertures and having at least one lead-out pads thereon connected to said inner conductive fingers of said first conductive foil pattern a second flexible printed circuit bottom tape, said bottom tape comprising a second dielectric carrier having a plurality of device apertures therein for receiving active semiconductor devices and a plurality of indexing apertures, said apertures in said bottom tape having the same location pattern as said apertures in said top tape, an adhesive layer bonding the top of said bottom tape to the bottom of said top tape to form a multilayer laminate therewith, a second flexible conductive foil pattern bonded to the bottom of said bottom tape comprising a plurality of intermediate flexible conductive paths thereon, and at least one terminal lead-out pad on the bottom of said semiconductor devices, said plurality of intermediate flexible conductive paths on said second flexible conductive foil pattern being bonded to said terminal lead-out pad to form an assembled circuit between said terminal lead out pad and said outer flexible conductive leads.

11. A multilayer flexible printed circuit tape as set forth in claim 10 wherein said plurality of intermediate flexible conductive paths comprise continuous foil terminal pads covering the bottom of said semiconductor devices.

12. A multilayer flexible printed circuit tape as set forth in claim 10 which further comprises:

a plurality of connection apertures in said top tape and said bottom tape, a plurality of outer flexible leads on said first flexible conductive foil pattern, said outer flexible leads extending through said connection apertures of said tapes and being bonded to individual ones of said intermediate flexible conductive paths on said second flexible conductive foil pattern.

* * * * *